(12) United States Patent
Nakamura

(10) Patent No.: US 11,762,228 B2
(45) Date of Patent: Sep. 19, 2023

(54) DISPLAY DEVICE COMPRISING A FLEXIBLE PRINTED CIRCUIT BOARD PROVIDED ALONG A FLEXIBLE CIRCUIT BOARD GUIDE

(71) Applicant: SHARP KABUSHIKI KAISHA, Sakai (JP)

(72) Inventor: Katsutoshi Nakamura, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/974,520

(22) Filed: Oct. 27, 2022

(65) Prior Publication Data
US 2023/0135713 A1    May 4, 2023

(30) Foreign Application Priority Data

Nov. 1, 2021   (JP) .................................. 2021-178478

(51) Int. Cl.
*G02F 1/1333*    (2006.01)
*H05K 1/18*    (2006.01)

(52) U.S. Cl.
CPC ....... *G02F 1/133314* (2021.01); *H05K 1/189* (2013.01); *H05K 2201/10136* (2013.01)

(58) Field of Classification Search
CPC .......................................... H05K 2201/10136
See application file for complete search history.

(56) References Cited

U.S. PATENT DOCUMENTS

| | | | |
|---|---|---|---|
| 2009/0103282 A1* | 4/2009 | Itaya | G02B 6/0083 362/97.1 |
| 2011/0120770 A1* | 5/2011 | Yokonuma | H05K 1/0215 174/94 S |
| 2018/0196300 A1* | 7/2018 | Jung | G06F 1/1637 |

FOREIGN PATENT DOCUMENTS

| | | | | |
|---|---|---|---|---|
| CN | 1811543 A | * | 8/2006 | ......... G02F 1/13452 |
| JP | H11338368 A | | 12/1999 | |
| KR | 20180016677 A | * | 2/2018 | ......... G02F 1/13458 |

* cited by examiner

*Primary Examiner* — Paul C Lee
(74) *Attorney, Agent, or Firm* — ScienBiziP, P.C.

(57) ABSTRACT

A display device in the present disclosure includes: a display panel having a display on a front surface; a flexible circuit board connected to the display panel; and a panel chassis supporting a rear surface of the display panel. On an outer side of a lateral end of the display panel, the panel chassis has a flexible circuit board guide projected from the rear surface side of the display panel to the front surface side thereof. The flexible circuit board is provided along the flexible circuit board guide in a manner to extend on an outer side thereof.

5 Claims, 3 Drawing Sheets

DISPLAY DEVICE COMPRISING A FLEXIBLE PRINTED CIRCUIT BOARD PROVIDED ALONG A FLEXIBLE CIRCUIT BOARD GUIDE

BACKGROUND OF THE INVENTION

Field of the Invention

The present disclosure relates to a display device.

Description of the Background Art

Conventionally, a display panel and a flexible circuit board are connected to each other in display devices.

For example, in the related art, a liquid-crystal display device is disclosed. The liquid-crystal display device includes: a tape carrier package to which a terminal around a display of a liquid-crystal panel is connected; and a spacer that is held between the tape carrier package and either one of a backlight panel, which opposes the terminal of the liquid-crystal panel, and a bezel, so as to provide a clearance between the display of the liquid-crystal panel and respective one of the backlight panel and the bezel. In the liquid-crystal display device disclosed in the related art, the spacer covers a substantially entire area of a connector between the terminal of the liquid-crystal panel and the tape-carrier package, and is projected outward from an outer edge of the connector. In this way, a bending start point of the TCP is changed from the outer edge of the connector to an edge of the spacer, and a direction of a force applied to the connector is shifted by 90° to prevent stress concentration on the outer edge of the connector. Therefore, it is possible to prevent peeling of the tape carrier package from the terminal.

However, from a viewpoint of quality assurance, further prevention of peeling of the flexible circuit board may be requested.

In view of the above problem, the present disclosure has a purpose of providing a display device capable of further preventing peeling of a flexible circuit board.

SUMMARY OF THE INVENTION

An aspect of the present disclosure includes: a display panel having a display on a front surface; a flexible circuit board connected to the display panel; and a panel chassis supporting a rear surface of the display panel. On an outer side of a lateral end of the display panel, the panel chassis has a flexible circuit board guide projected from the rear surface side of the display panel to the front surface side thereof. The flexible circuit board is provided along the flexible circuit board guide in a manner to extend on an outer side thereof.

According to the present disclosure that has been described so far, it is possible to provide the display device capable of preventing further peeling of the flexible circuit board.

DESCRIPTION OF THE PREFERRED EMBODIMENTS

A detailed description will hereinafter be made on a preferred embodiment of the present disclosure with reference to the drawings. This embodiment, which will be described below, does not unduly limit contents of the present disclosure described in the claims, and not all of configurations, which will be described in this embodiment, may not be essential as the solution in the present disclosure.

Figure 1:
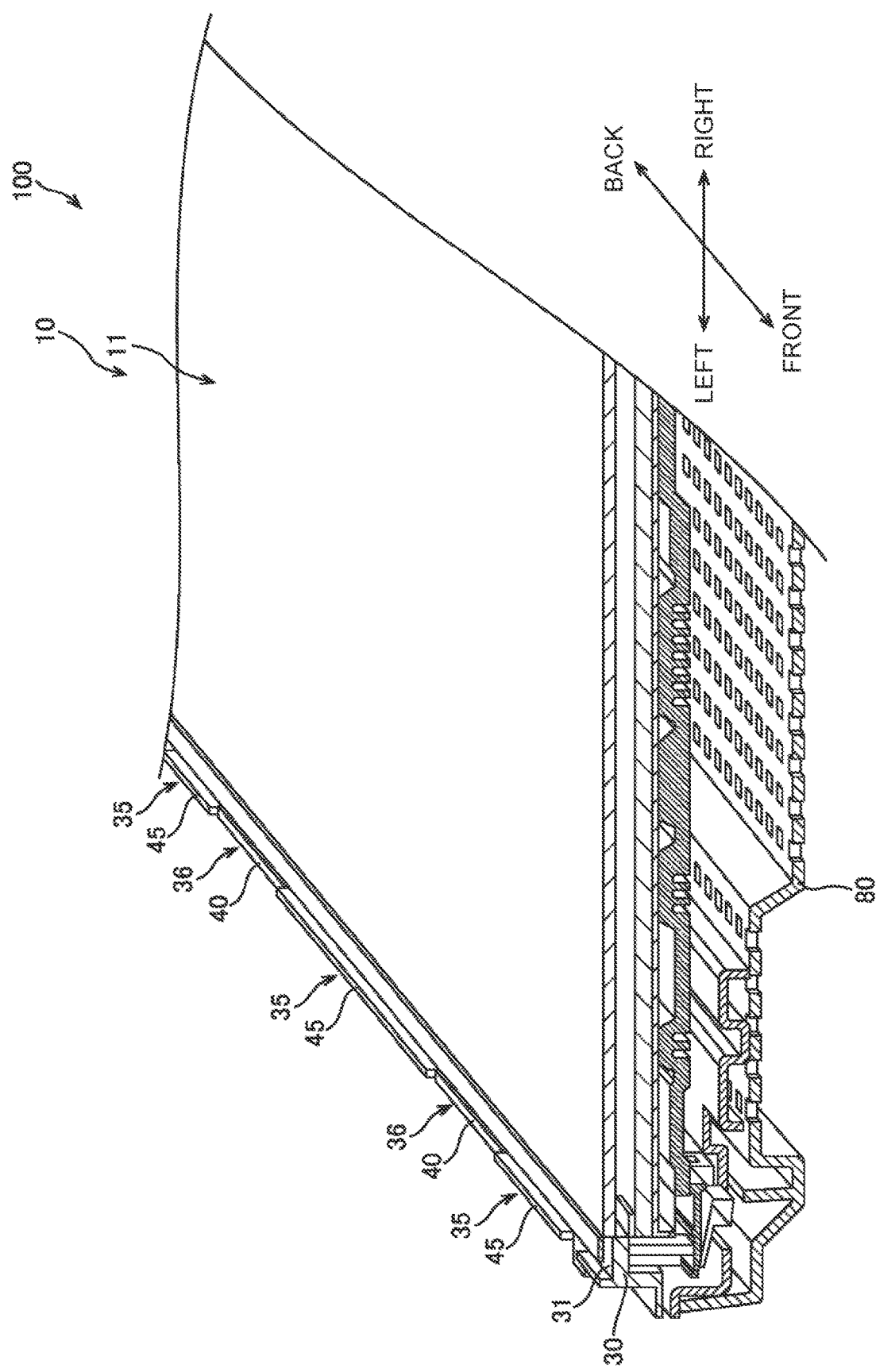
FIG. 1 is a perspective view schematically illustrating a display device according to the present disclosure.
Figure 2:
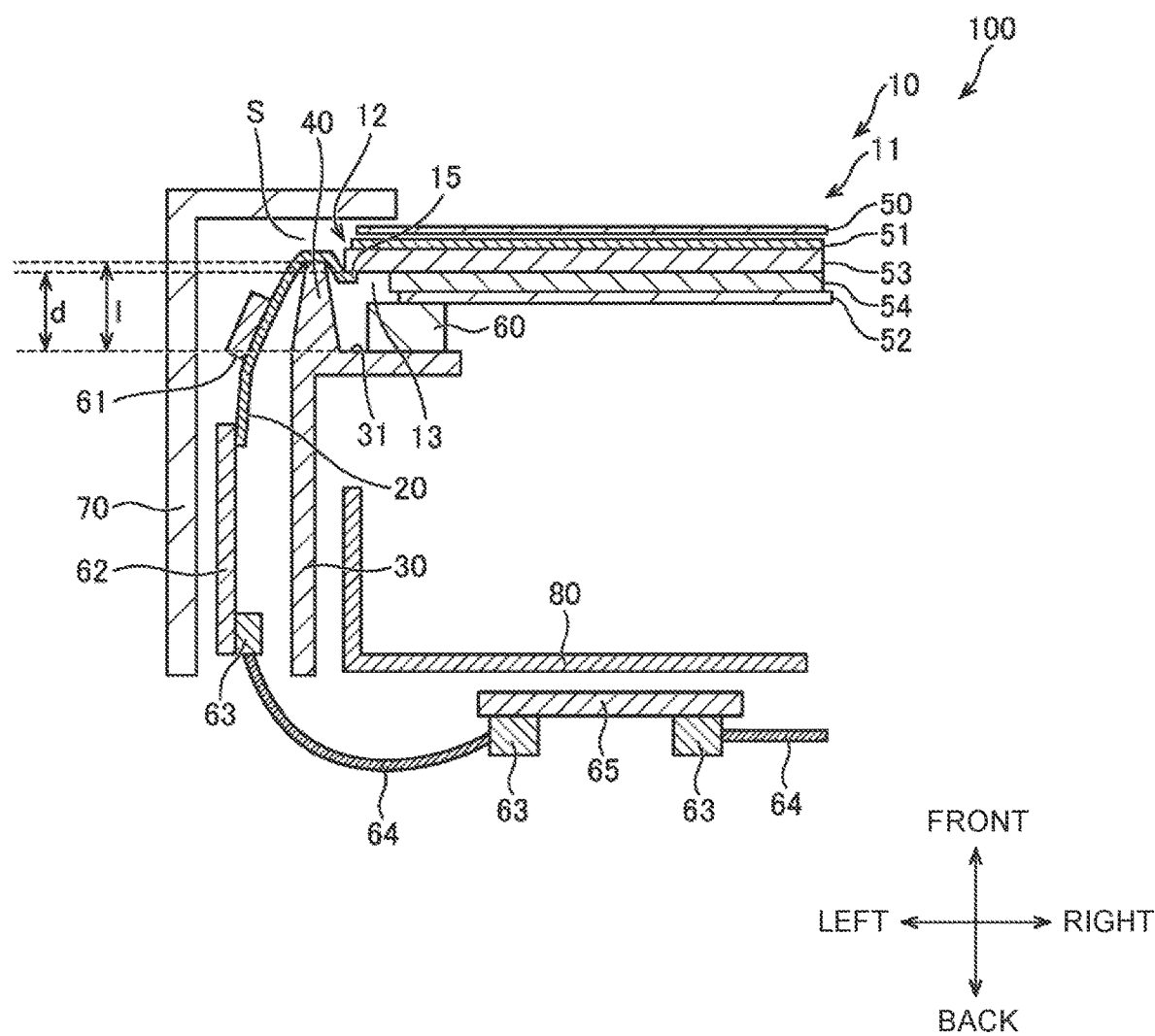
FIG. 2 is a cross-sectional view that is taken along A-A at the time of connecting a flexible circuit board to the display device in FIG. 1.
Figure 3:
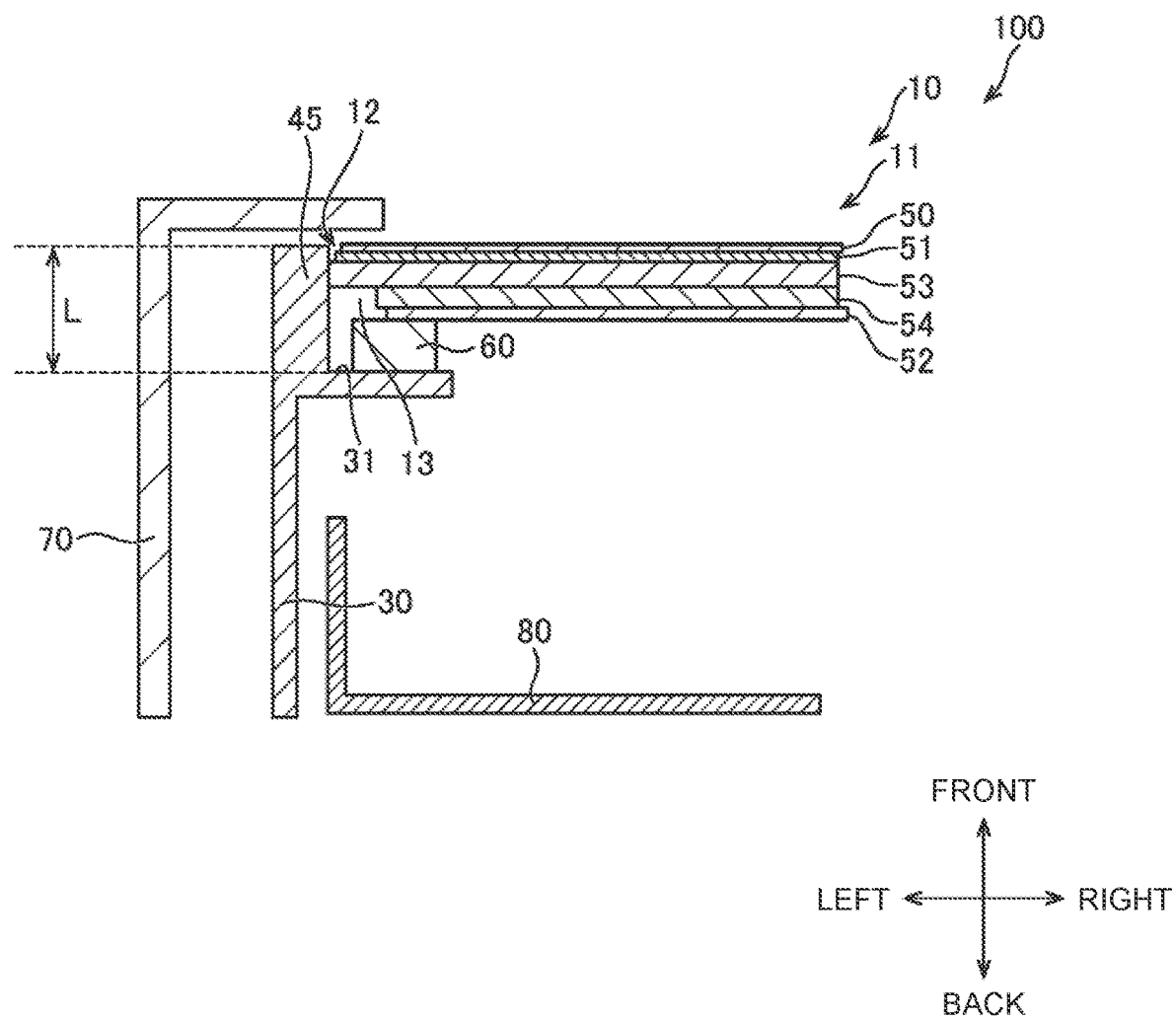
FIG. 3 is a cross-sectional view that is taken along B-B at the time of connecting the flexible circuit board to the display device in FIG. 1.

FIG. 1 is a perspective view schematically illustrating a display device 100 according to the present disclosure. FIG. 2 is a cross-sectional view that is taken along A-A at the time of connecting a flexible circuit board 20 to the display device 100 in FIG. 1. FIG. 3 is a cross-sectional view that is taken along B-B at the time of connecting the flexible circuit board 20 to the display device 100 in FIG. 1. As illustrated in FIG. 1 to FIG. 3, the display device 100 according to the present disclosure includes a display panel 10, the flexible circuit board 20, and a panel chassis 30. In order to facilitate understanding of characteristics of the display device 100 according to the present disclosure, the flexible circuit board 20 and a bezel 70 on an outer side of the panel chassis 30 are not illustrated in FIG. 1.

For example, the display device 100 according to the present disclosure is incorporated as a display panel module into a television receiver, a monitor display, or another device.

The display panel 10 that is provided in the display device 100 according to the present disclosure has a display 11 on a front surface. The display 11 is configured to include polarizing plates 51, 52, a TFT 53 (switching element), a color filter (CF) 54, and the like, and may additionally include an optical sheet 50 and a backlight (not illustrated).

The display panel 10 is a self-illuminating display panel, but can be an organic EL panel using organic light-emitting diode elements.

Furthermore, as illustrated in FIG. 2, the TFT 53 extends outward from an end of the CF 54 and thus has an exposed section 13, in which a rear surface of the TFT 53 is partially exposed to the outside. A connector 15 is formed in the exposed section 13.

The flexible circuit board 20 that is provided in the display device 100 according to the present disclosure is connected to the display panel 10. One end of the flexible circuit board 20 is connected to the display panel 10 while the other end thereof is connected to a signal generation board 62 that generates a signal to be input to the display panel 10. The flexible circuit board 20 has a driver 61.

In addition, the flexible circuit board 20 is disposed in a manner to provide a clearance from a second area 36 on a periphery of the display panel 10 in each of a back direction and a front direction.

The signal generation board 62 is connected to a timing control board 65 via a connection member 64 and a terminal 63. The signal generation board 62 is a print circuit board on which electronic parts such as a capacitor, a resistor, and a diode, are mounted, and an example of the signal generation board 62 is a source board.

The panel chassis 30 that is provided in the display device 100 according to the present disclosure supports a rear surface near an end of the display panel 10 via a cushioning material 60 and the like. Meanwhile, the bezel 70 supports a front surface near the end of the display panel 10.

The display device 100 according to the present disclosure includes a backlight chassis 80. The backlight chassis 80 substantially has a box shape, and includes an optical member group and a reflective sheet.

The panel chassis 30 is constructed of metal, such as aluminum or iron, having high thermal conductivity.

As illustrated in FIG. 1 to FIG. 3, on an outer side of a lateral end 12 of the display panel 10, the panel chassis 30 has a flexible circuit board guide 40 that is projected from the rear surface side of the display panel 10 to the front surface side thereof. Then, the flexible circuit board 20 is provided along the flexible circuit board guide 40 in a manner to extend on the outer side of the panel chassis 30.

In the case where the flexible circuit board guide 40 is not provided, the flexible circuit board 20 is likely to be peeled from the display panel 10 due to weight of the flexible circuit board 20 and the signal generation board 62, which is connected to the flexible circuit board 20.

In order to handle such a problem, the flexible circuit board guide 40 is provided, and the flexible circuit board 20 is provided along the flexible circuit board guide 40 from the connector 15 with the display panel 10 in a manner to extend on the outer side of the flexible circuit board guide 40. Consequently, a frictional force is generated between the flexible circuit board 20 and the flexible circuit board guide 40, which can prevent peeling of the flexible circuit board 20 from the connector 15 with the display panel 10.

As described above, the display panel 10 that is provided in the display device 100 according to the present disclosure has the flexible circuit board guide 40. Thus, in the structure in which the TFT 53 and the CF 54 are arranged in this order from the rear surface of the display panel 10, it is possible to further prevent peeling of the flexible circuit board.

Furthermore, in the structure as illustrated in FIG. 2 and FIG. 3 that supports high brightness and in which the CF 54 and the TFT 53 are arranged in this order from the rear surface of the display panel 10, the flexible circuit board 20 is connected to the rear surface of the TFT 53, and thus the flexible circuit board is further likely to be peeled. However, since the display panel 10 that is provided in the display device 100 according to the present disclosure has the flexible circuit board guide 40, it is possible to further prevent peeling of the flexible circuit board even with provision of the connector 15 on the rear surface of the display panel 10.

Compared to the former structure, the latter structure as illustrated in FIG. 2 and FIG. 3 can further exert an effect of preventing peeling of the flexible circuit board.

The flexible circuit board guide 40 may not abut the lateral end 12 of the display panel 10. As illustrated in FIG. 1, an area where the flexible circuit board guide 40 is provided is an area where the flexible circuit board 20 is drawn out. Thus, such an area does not abut an entire surface of the lateral end 12 (an end in a lateral direction of the panel and a lateral surface portion) of the display panel 10, and is provided with a clearance S (spacing) through which the flexible circuit board 20 passes.

As illustrated in FIG. 1 and FIG. 3, in a first area 35 on the periphery of the display panel 10, the panel chassis 30 has a display panel restrictor 45 that is projected from the rear surface side of the display panel 10 to the front surface side thereof and abuts the lateral surface of the display panel 10, so as to restrict movement of the display panel 10 in a plane direction. The plane direction corresponds to a left direction, a right direction, the back direction, and the front direction in FIG. 1. In addition, as illustrated in FIG. 1 and FIG. 2, in the second area 36 on the periphery of the display panel 10, the panel chassis 30 has the flexible circuit board guide 40.

A projection length l of the flexible circuit board guide 40, which is projected from the rear surface side of the display panel 10 to the front surface side thereof, is preferably shorter than a projection length L of the display panel restrictor 45, which is projected from the rear surface side of the display panel 10 to the front surface side thereof. That is, l<L. In order to draw out the flexible circuit board 20, the area where the flexible circuit board guide 40 is provided has a shorter length than the projection length L of the display panel restrictor 45 as another area. In other words, a projection height of the flexible circuit board guide 40 is less than a projection height of the display panel restrictor 45. Thus, an end of the panel chassis 30 has a notched shape.

As illustrated in FIG. 2, a tip of the flexible circuit board guide 40 is preferably located on the front surface side from the connector 15. That, is, the projection length l of the flexible circuit board guide 40 is preferably longer than a distance d from flat part 31 of the panel chassis 30 to the connector 15. In this way, the flexible circuit board 20 obtains a U-shape in a cross-sectional view as illustrated in FIG. 2, and the frictional force between the flexible circuit board guide 40 and the flexible circuit board 20 is improved. Thus, it is possible to further prevent peeling of the flexible circuit board.

The tip of the flexible circuit board guide 40 preferably has a tapered shape. In this way, the frictional force between the flexible circuit board guide 40 and the flexible circuit board 20 is improved. Thus, it is possible to further prevent peeling of the flexible circuit board.

The one end of the flexible circuit board 20 is connected to the display panel 10 while the other end thereof is connected to the signal generation board 62.

According to such a structure, the flexible circuit board 20 is likely to be peeled due to weight of those components. However, since the display panel 10 that is provided in the display device 100 according to the present disclosure has the flexible circuit board guide 40, it is possible to prevent peeling of the flexible circuit board even in such a structure.

As it has been described so far, in the display device 100 according to the present disclosure, it is possible to further prevent peeling of the flexible circuit board.

Although the detailed description has been made on the embodiments and the examples, those skilled in the art will easily understand that many modifications can be made within the scope that does not substantially depart from the novelties and effects of the present disclosure. Therefore, all such modifications shall be included within the scope of the present disclosure.

For example, a term that is described at least once in the specification or the drawings along with a different term that has broader or synonymous meaning can be replaced by the different term anywhere in the specification or the drawings. The configuration and operation of the display device are also not limited to those described in the embodiments and the examples, and various modifications can be made thereto.

What is claimed is:
1. A display device comprising:
a display panel having a display on a front surface;
a flexible circuit board connected to the display panel; and
a panel chassis supporting a rear surface of the display panel, wherein on an outer side of a lateral end of the display panel, the panel chassis has a flexible circuit board guide that is projected from a rear surface side of the display panel to a front surface side thereof, the flexible circuit board is provided along the flexible circuit board guide in a manner to extend on an outer side of the flexible circuit board guide, the panel chassis has, in a first area on a periphery of the display panel, a display panel restrictor that is projected from the rear surface side of the display panel to the front surface side of the display panel and abuts a lateral surface of the display panel, so as to restrict a movement of the display panel in a plane direction, the panel chassis has, in a second area on the periphery of the display panel, the flexible circuit board guide, and a projection length of the flexible circuit board guide, which is projected from the rear surface side of the display panel to the front surface side of the display panel, is shorter than a projection length of the display panel restrictor, which is projected from the rear surface side of the display panel to the front surface side of the display panel.

2. The display device according to claim 1, wherein
the flexible circuit board guide does not abut the lateral end of the display panel.

3. The display device according to claim 1, wherein
a connector that connects the display panel and the flexible circuit board is provided on the rear surface of the display panel.

4. The display device according to claim 1, wherein
a tip of the flexible circuit board guide has a tapered shape.

5. The display device according to claim 1, wherein
one end of the flexible circuit board is connected to the display panel, and another end of the flexible circuit board is connected to a signal generation board that generates a signal to be input to the display panel.

* * * * *